(12) United States Patent
Lin

(10) Patent No.: US 6,343,014 B1
(45) Date of Patent: Jan. 29, 2002

(54) CPU COOLING ARRANGEMENT

(75) Inventor: San Yaun Lin, Taoyuan (TW)

(73) Assignee: Ming-Chuan Yu (TW)

( * ) Notice: Subject to any disclaimer, the term of this patent is extended or adjusted under 35 U.S.C. 154(b) by 0 days.

(21) Appl. No.: 09/637,782

(22) Filed: Aug. 11, 2000

(51) Int. Cl.⁷ ................................. H05K 7/20
(52) U.S. Cl. ................ 361/697; 165/121; 415/66
(58) Field of Search ............... 415/55.5, 61, 66, 415/213.1, 214.1, 177, 178; 174/16.1, 16.3; 257/222; 312/236; 454/184; 165/80.3, 120–126; 361/687, 690, 695, 697, 717–719

(56) References Cited

U.S. PATENT DOCUMENTS

| | | | | |
|---|---|---|---|---|
| 5,546,272 A | * | 8/1996 | Moss et al. | 361/687 |
| 5,638,895 A | * | 6/1997 | Dodson | 165/121 |
| 6,031,717 A | * | 2/2000 | Baddour et al. | 361/687 |
| 6,175,495 B1 | * | 1/2001 | Batchelder | |
| 6,181,556 B1 | * | 1/2001 | Allman | |

* cited by examiner

*Primary Examiner*—Gerald Tolin
(74) *Attorney, Agent, or Firm*—Troxell Law Office PLLC

(57) ABSTRACT

A CPU cooling arrangement includes a heat sink adapted to receive heat from the CPU of a computer, and a plurality of fans arranged in a stack on the heat sink and adapted to draw outside cold air toward the heat sink for quick dissipation of heat from the heat, the fans being connected in series and spaced from one another by spacer means thereof.

1 Claim, 3 Drawing Sheets

CPU COOLING ARRANGEMENT

BACKGROUND OF THE INVENTION

The present invention relates to a CPU cooling arrangement, and more particularly to such a CPU cooling arrangement, which uses a series of fans to effectively carry heat away from the CPU through a heat sink.

Conventionally, computer manufacturers commonly use a heat sink and a fan to dissipate heat from the CPU of a computer. The heat sink is maintained in close contact with the surface of the CPU, and the fan is mounted on the heat sink to draw outside cold air toward the heat sink, enabling heat to be quickly carried away from the CPU through the heat sink. If the fan fails during the operation of the computer and the computer user does not know the failure of the fan, the CPU becomes overheat quickly, and will be damaged in a short time.

SUMMARY OF THE INVENTION

The invention has been accomplished under the circumstances in view. According to one aspect of the present invention, the CPU cooling arrangement comprises a heat sink and a plurality of fans connected in series and arranged with the heat sink in a stack for quick dissipation of heat from the heat sink. According to another aspect of the present invention, spacer means are provided to keep the fans spaced from one another at a distance for ventilation. Because multiple fans are used, the cooling operation keeps functioning in case either fan is out of work. Further, because of multiple fans are used, the size of the heat sink can be minimized without affecting the heat dissipation effect.

DETAILED DESCRIPTION OF THE PREFERRED EMBODIMENT

Figure 1:
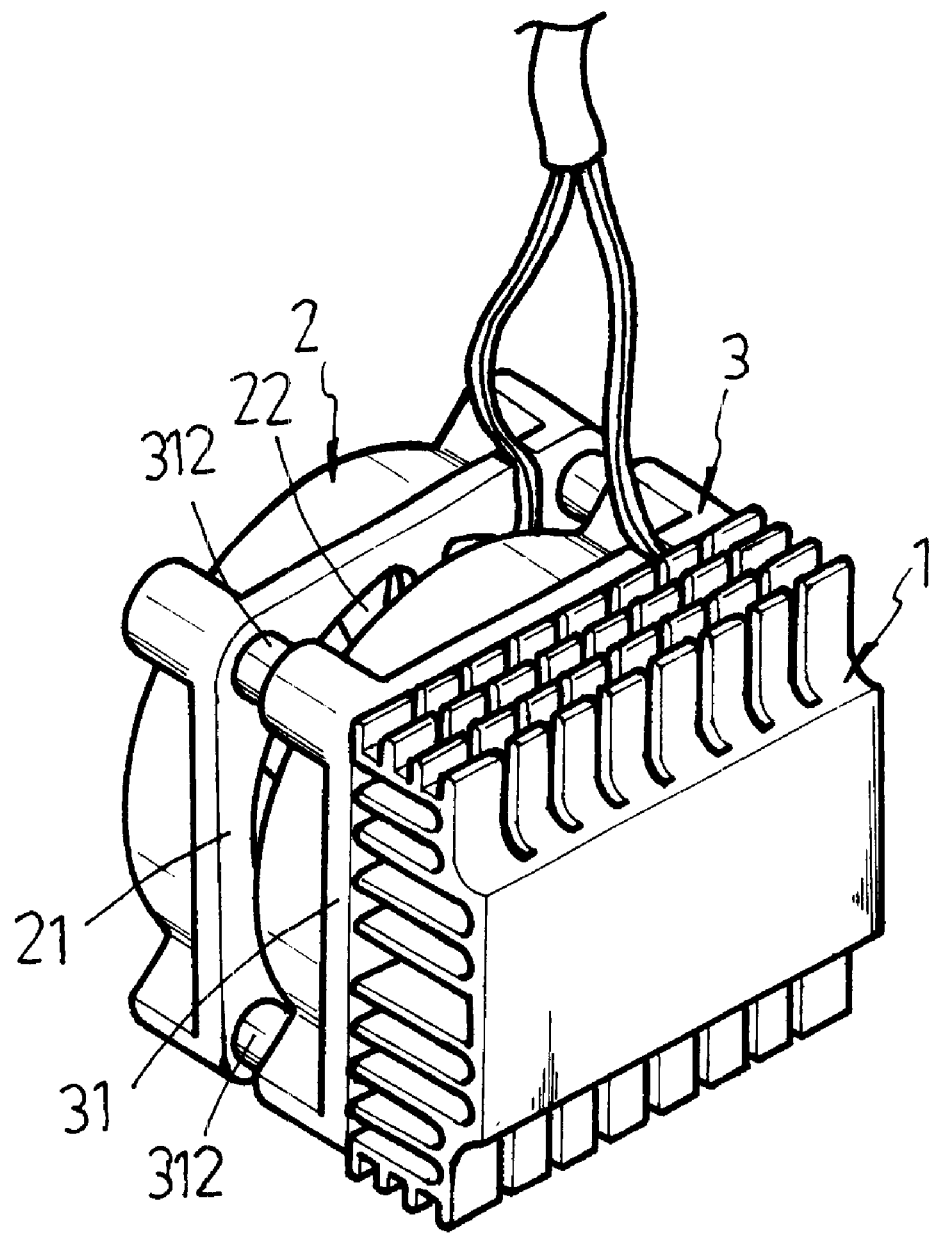
FIG. 1 is a perspective view of the present invention.
Figure 2:
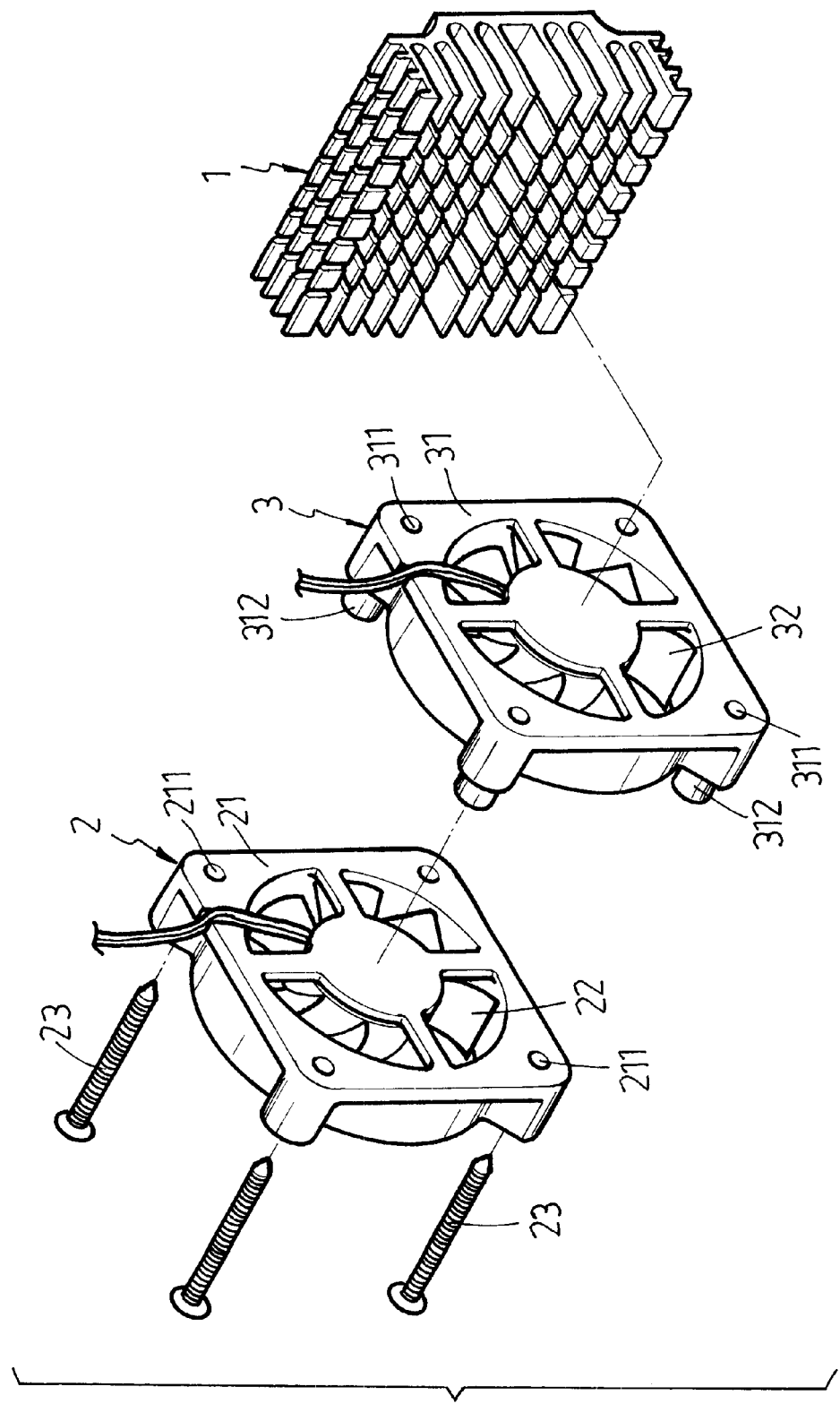
FIG. 2 is a schematic drawing showing an application example of the present invention.

Referring to FIGS. 1 and 2, a CPU cooling arrangement in accordance with the present invention comprises a heat sink 1, and a plurality of, for example, two fans, namely, the first fan 2 and the second fan 3. The fans 2 and 3 each comprise a housing 21 or 31, a fan blade assembly 22 or 32 mounted inside the housing 21 or 31, and a plurality of through holes 211 or 311 respectively disposed in four corners thereof. The second fan 3 further comprises a plurality of tubular spacers 312 raised from the top side wall thereof around the respective through holes 311. Screws 23 are respectively inserted through the through holes 211 on the first fan 2 and the tubular spacers 312 and through holes 311 of the second fan 3, and threaded into gaps between radiation fins of the heat sink 1 to secure the fans 2 and 3 and the heat sink 1 in a stack.

Figure 3:
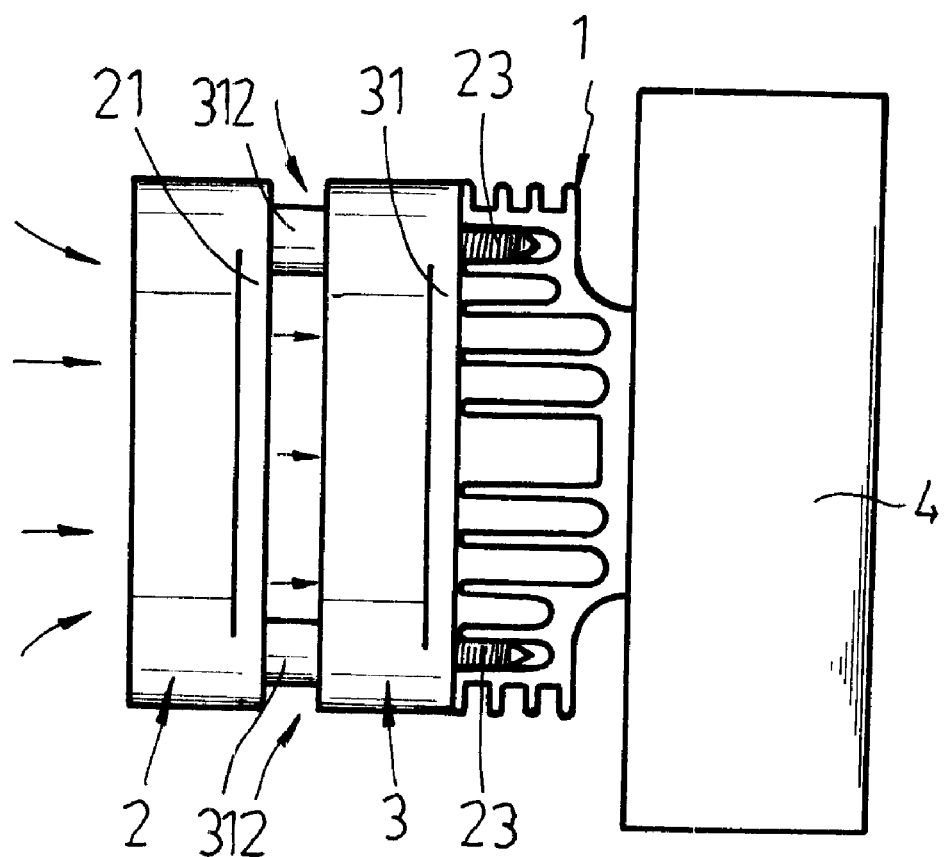
FIG. 3 is an exploded view of the present invention.

Referring to FIG. 3, when in use, the heat sink 1 is closely attached to the CPU 4 to receive heat from the CPU 4. During the operation of the CPU, the first fan 2 draws outside cold air toward the second fan 3, and the second fan 3 draws outside cold air toward the heat sink 1, causing heat to be quickly dissipated from the heat sink 1 into the air. Because two fans 2 and 3 are used, the CPU cooling arrangement still functions well in case either fan 2 or 3 is damaged. Further, because the tubular spacers 312 keep the first fan 2 away from the top side wall of the housing 31 of the second fan 3, outside cold air can be effectively drawn through the second fan 3 toward the heat sink 1 to quickly carry heat away from the heat sink 1 and the CPU 4.

What the invention claimed is:

1. A CPU cooling device comprising:
   a) a heat sink having a plurality of spaced apart heat radiation fins;
   b) a first fan including a rotatable first fan blade mounted in a first housing;
   c) a second fan including a rotatable second fan blade mounted in a second housing, the second housing being in contact with the heat radiation fins;
   d) a plurality of spacer elements between the first and second housings so as to space the first housing from the second housing; and,
   e) a plurality of threaded fasteners extending through the first housing, the spacer element and the second housing and threadingly engaged with the heat radiation fins, whereby the space between the first and second housings forms an inlet area for the second fan.

* * * * *